United States Patent
Becker et al.

(10) Patent No.: US 7,148,698 B2
(45) Date of Patent: Dec. 12, 2006

(54) FUSE SAVING TESTER FOR FUSED CIRCUIT

(75) Inventors: Thomas P. Becker, Kenosha, WI (US); Daniel D. Lionberg, Milwaukee, WI (US); Matthew D. Crass, Pleasant Prairie, WI (US); William G. Bruno, Antioch, IL (US)

(73) Assignee: Snap-on Incorporated, Kenosha, WI (US)

( * ) Notice: Subject to any disclaimer, the term of this patent is extended or adjusted under 35 U.S.C. 154(b) by 83 days.

(21) Appl. No.: 10/251,242

(22) Filed: Sep. 20, 2002

(65) Prior Publication Data

US 2004/0017203 A1 Jan. 29, 2004

Related U.S. Application Data

(60) Provisional application No. 60/382,934, filed on May 24, 2002, provisional application No. 60/323,384, filed on Sep. 20, 2001.

(51) Int. Cl.
*G01R 31/02* (2006.01)
*H01H 85/30* (2006.01)
*H01H 31/02* (2006.01)

(52) U.S. Cl. ................... 324/550; 324/555

(58) Field of Classification Search ........... 324/415, 324/424, 508, 509, 523, 537, 550, 555; 340/638
See application file for complete search history.

(56) References Cited

U.S. PATENT DOCUMENTS

| | | | | |
|---|---|---|---|---|
| 2,044,546 A | 6/1936 | Ryan et al. | ............... | 324/503 |
| 2,685,061 A | 7/1954 | Stelzenmüller | ............ | 324/503 |
| 2,716,216 A | 8/1955 | Schwenzfeier | ............ | 324/133 |
| 3,074,013 A | 1/1963 | Bowden | ............... | 324/503 |
| 3,621,384 A | 11/1971 | Yamada | ............... | 324/529 |
| 3,663,939 A | 5/1972 | Olsson | ............... | 320/107 |
| 3,699,433 A * | 10/1972 | Smith, Jr. | ............... | 324/523 |
| 4,021,730 A | 5/1977 | Brinegar | ............... | 324/523 |
| 4,104,581 A | 8/1978 | Arkosy | ............... | 324/523 |
| 4,129,825 A | 12/1978 | Brinegar | ............... | 324/523 |
| 4,162,478 A | 7/1979 | Huber et al. | ............ | 340/459 |
| 4,177,420 A | 12/1979 | Tripp | ............... | 324/503 |
| 4,276,509 A | 6/1981 | Bryant et al. | ............ | 324/505 |
| 4,360,851 A * | 11/1982 | Zundel | ............... | 361/59 |
| 4,540,940 A | 9/1985 | Nolan | ............... | 324/133 |
| 4,602,216 A * | 7/1986 | Keel | ............... | 324/126 |

(Continued)

FOREIGN PATENT DOCUMENTS

EP           0012137           6/1980

*Primary Examiner*—Anjan Deb
*Assistant Examiner*—John Teresinski
(74) *Attorney, Agent, or Firm*—Seyfarth Shaw LLP; Harold V. Stotland

(57) ABSTRACT

In one form, tester for an electrical system, such as for a vehicle, develops repetitively applied, short duration, control current pulses for reducing load current pulses through the electrical system. An operator connects a pair of input contacts across a fuse holder. A circuit between the input contacts is closed momentarily and repetitively to produce repetitive current pulses from the electricity source through the system. A perceptible alert is produced when the magnitude of the current pulse exceeds that of a prescribed reference current value. In another form, a tester for an electrical system is designed to plug into the fuse terminals in a fuse box. The tester can include a plurality of interchangeable circuit breaker modules to allow the tester to be used on circuits having differing current ratings.

20 Claims, 13 Drawing Sheets

U.S. PATENT DOCUMENTS

| | | | | |
|---|---|---|---|---|
| 4,837,519 | A | 6/1989 | Lopetrone et al. | 324/529 |
| 4,878,025 | A | 10/1989 | Persson | 324/503 |
| 4,884,033 | A | 11/1989 | McConchie Sr. | 324/503 |
| 4,929,901 | A | 5/1990 | Kimball et al. | 324/529 |
| 4,945,346 | A | 7/1990 | Schmiemann | 340/656 |
| 4,986,767 | A | 1/1991 | Kozel | 439/621 |
| 5,030,916 | A | 7/1991 | Bokitch | 324/503 |
| 5,095,276 | A | 3/1992 | Nepil | 324/504 |
| 5,153,523 | A | 10/1992 | Samaniego | 324/550 |
| 5,154,640 | A | 10/1992 | Chen et al. | 439/621 |
| 5,324,214 | A | 6/1994 | De Castro | 439/621 |
| 5,334,939 | A * | 8/1994 | Yarbrough | 324/424 |
| 5,343,192 | A * | 8/1994 | Yenisey | 340/639 |
| 5,594,610 | A * | 1/1997 | Robirds et al. | 361/104 |
| 5,606,483 | A | 2/1997 | Sawai et al. | 361/106 |
| 5,629,680 | A | 5/1997 | Makhija | 340/664 |
| 5,640,093 | A | 6/1997 | Murray et al. | 324/379 |
| 5,645,746 | A | 7/1997 | Walsh | 219/505 |
| 5,701,081 | A | 12/1997 | Rapaport | 324/555 |
| 5,818,676 | A | 10/1998 | Gronowicz, Jr. | 361/106 |
| 5,874,884 | A * | 2/1999 | Hull et al. | 337/241 |
| 5,882,229 | A | 3/1999 | Caren et al. | 439/621 |
| 5,926,354 | A | 7/1999 | King | 361/93.4 |
| 5,951,328 | A | 9/1999 | Roper, Jr. | 439/624 |
| 5,956,218 | A * | 9/1999 | Berthold | 361/42 |
| 6,043,661 | A | 3/2000 | Gutierrez | 324/504 |
| 6,168,471 | B1 | 1/2001 | Santa Cruz et al. | 439/621 |
| 6,198,272 | B1 | 3/2001 | Pool et al. | 324/133 |
| 6,225,610 | B1 | 5/2001 | Walsh | 219/505 |
| 6,252,409 | B1 | 6/2001 | Iijima | 324/529 |
| 6,429,663 | B1 * | 8/2002 | LaCoste | 324/550 |
| 6,608,486 | B1 * | 8/2003 | Betts | 324/503 |
| 6,657,435 | B1 * | 12/2003 | Brown | 324/508 |
| 6,686,744 | B1 * | 2/2004 | Tinsley | 324/507 |
| 6,781,809 | B1 * | 8/2004 | Milanczak | 361/104 |

* cited by examiner

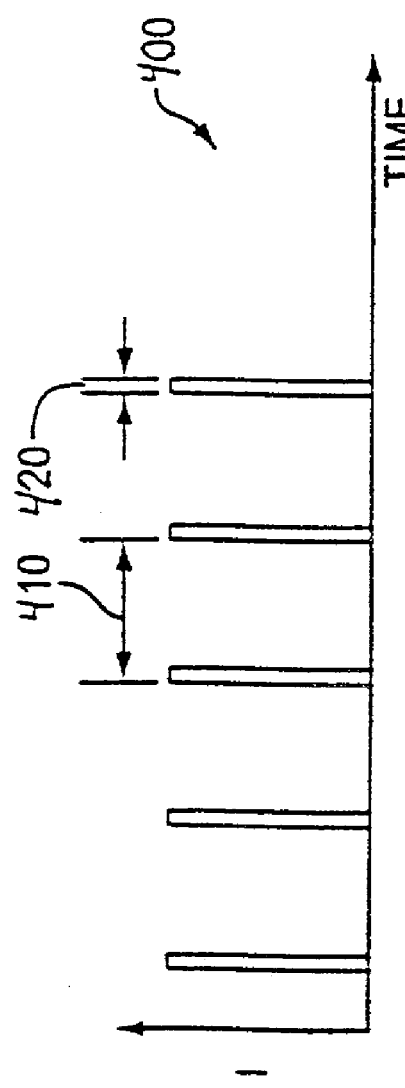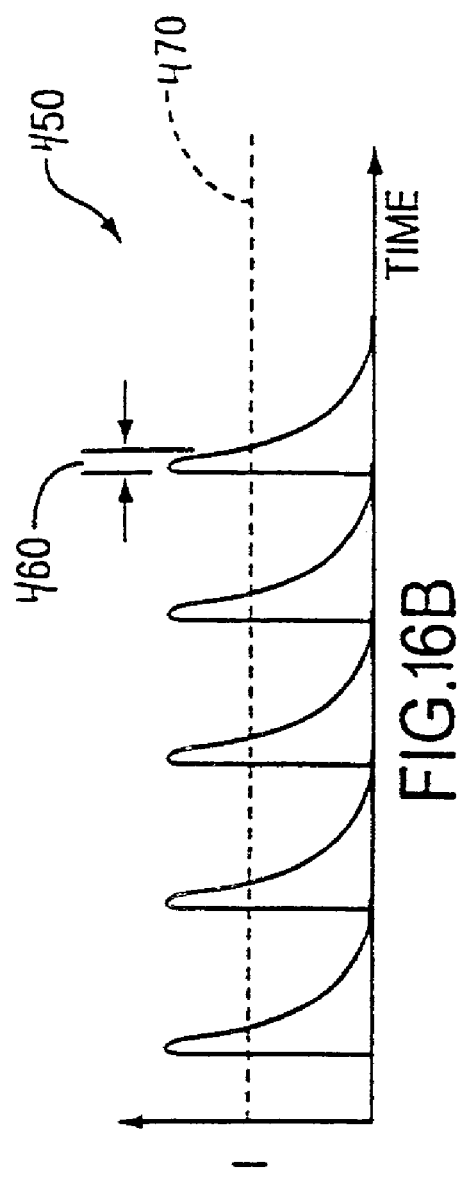

ed reference current value. In one form, the prescribed reference current is adjustable.

FUSE SAVING TESTER FOR FUSED CIRCUIT

RELATED APPLICATIONS

This application claims the benefit of the filing date of copending U.S. Provisional Application Nos. 60/382,934, filed May 24, 2002 and 60/323,384, filed Sep. 20, 2001, the disclosures of which are both incorporated herein by reference.

BACKGROUND

This application relates to testers and, in particular, to testers for testing fused circuits, such as short circuit or grounded circuit detectors and indicators.

Many electrical systems include a plurality of fused circuits, the fuses of which are disposed in a central fuse panel or box. It is often convenient to test the circuits at the fuse panel, if it is at a relatively easily-accessible location. When testing circuits at the fuse panel, the tester is often applied to the circuit being tested, in parallel with the fuse. When testing for short circuits, however, this procedure may result in blowing the fuse.

It is known to provide circuit testers with a built-in circuit breaker, which can be connected to a fuse panel in place of a fuse for testing the fused circuit. One such device is sold by Snap-on Tools Company under the designation YA809, which is a short circuit locator. YA809 has a breaker with a single high-current rating and, when YA809 is connected to circuits having a lower current rating, this permits the flow of potentially damaging currents in the circuit being tested. Furthermore, YA809 requires the technician to be at the location of the fuse panel in order to view the provided visual indicator. This may be inconvenient, the technician may need to be elsewhere along the tested circuit while the testing is being conducted. Another diagnostic technique for locating a short or current flow path carrying a current excess is to repeatedly replace the blown fuse until the fault is located. This can waste a large number of fuses before testing is successfully completed. A more practical method of testing is to momentarily provide current flow by a resettable breaker and attempting to locate the short.

One tester model has a 30-A self-resetting thermal breaker that is installed across the blown fuse and repetitively allows current flow to the short circuit in the form of current pulses. The breaker opens after a short thermal delay and then automatically resets after cooling down. A magnetic field surrounding the shorted wiring is generated during the momentary high current pulses as a result of the repetitive breaker action. The tester includes a needle magnetic detector that deflects in response to magnetic field. By moving the magnetic detector along the wiring harness, the user is able to locate the short when the meter stops deflecting.

The tester can be difficult to use because the detector must be in close proximity to the wiring to work. Additionally, the repetition rate of the thermal breaker is on the order of tens of seconds, which causes the technician to wait a long time at a location for the thermal breaker to close in order to see if the short is in that location. Such waiting period creates difficulties when the location of short is difficult to reach. The longer duration of current pulse also causes exposure of the electrical system to a potentially damaging high level of current for a longer period during each pulse. Thermal breakers are prone to premature failure and instability in that their shut-off current depends on temperature, age and other external elements.

Another circuit tester, instead of allowing high current flow, uses high frequency AC signals transmitted into a short circuit and an associated receiver that is moved along the wiring. The tester works while power to the electrical system is either on or off. The short is located when the signal drops to zero. Thus the time taken to insure proper connection slows down locating the short. The cost of such systems is relatively high making it a less desirable tool.

Accordingly, there exists a need for a tester for electrical systems that reacts to a short circuit condition more quickly, locating electrical faults faster without subjecting the system to damaging high current flow for long periods. There is further need for a tester that can test electrical systems independent of the polarity of contacts in the circuit under test. There also exists a need for a tester that is operated by setting the breaker current limit in order to quickly find the level of current the circuit is drawing.

SUMMARY

This application discloses an improved tester for electrical circuits, which avoids the disadvantages of prior testers, while affording additional structural and operating advantages.

There is disclosed a tester which can be plugged directly into a fuse panel in substitution for a fuse of a fused circuit.

There is further disclosed a tester which can be used for testing circuits of different current ratings without danger of exceeding the current rating of any circuit.

There is further disclosed a tester, which provides both audible and visual indications of test results.

There is further disclosed a tester which is of simple, compact and economical construction.

There is further disclosed a method of testing fused circuits without risk of blown fuses.

A switch is applied across the terminals of a fuse in a circuit under test, in which the switch is momentarily and repetitively closed to produce a short duration current pulse in the circuit, and in which the magnitude of the current pulse is compared with that of a prescribed reference current.

A method of testing an electrical system for current flow exceeding a prescribed value includes connecting a pair of contacts across a fuse holder for a fuse having a predetermined rating momentarily closing a circuit between the contacts to produce a current pulse through the electrical system, comparing the magnitude of the current pulse with a prescribed reference current value, and producing a perceptible signal when the magnitude of the current pulse exceeds that of the prescribed reference current value.

A diagnostic tester for electrical systems includes a pair of contacts for connection across a fuse holder for a fuse having a predetermined rating. A switch is controlled for momentarily closing between the contacts to produce a current pulse through the electrical system. A comparator compares the magnitude of the current pulse with a prescribed reference current value. An output device is connected for producing a perceptible signal that indicates when the magnitude of the current pulse exceeds that of the prescribed reference current value.

In one form, the current pulse is repeated until an operator identifies the location of circuit fault. The pulse duration is short enough so as not to damage the system during the current pulse. Seating test contacts in the fuse receptacle connects the pair of contacts. The tester input voltage is independent of the polarity of the connection to the pair of contacts. A potentiometer indicates and adjusts the prescribed current setting to provide a threshold proportional to the current rating of corresponding fuse.

A tester for testing an electrical system for excessive current flow includes a pair of contacts for connection across a fuse holder for a fuse having a predetermined rating. A switch is provided to momentarily close between the contacts to produce a control pulse through the electrical system. A microprocessor is programmed to momentarily close the switch to generate a current pulse through the circuit under test, compare the pulse with a prescribed reference current value and produce a perceptible signal when the magnitude of the current pulse exceeds that of the prescribed reference current value.

Momentarily closing a circuit between a pair of contacts produces a current pulse through the system. Subsequently, the electrical system is tested for current flow exceeding a prescribed value by comparing the magnitude of the current pulse with the prescribed value.

In one form, the current pulse is controlled to have a width within the range of 10–20 ms. The repetition rate of the pulse can be on the order of one pulse per second.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

FIGS. 16(A) and 16(B) demonstrate the waveform of pulses generated across the fuse holder and the response generated by the circuit under test; and.

DETAILED DESCRIPTION

Figure 1:
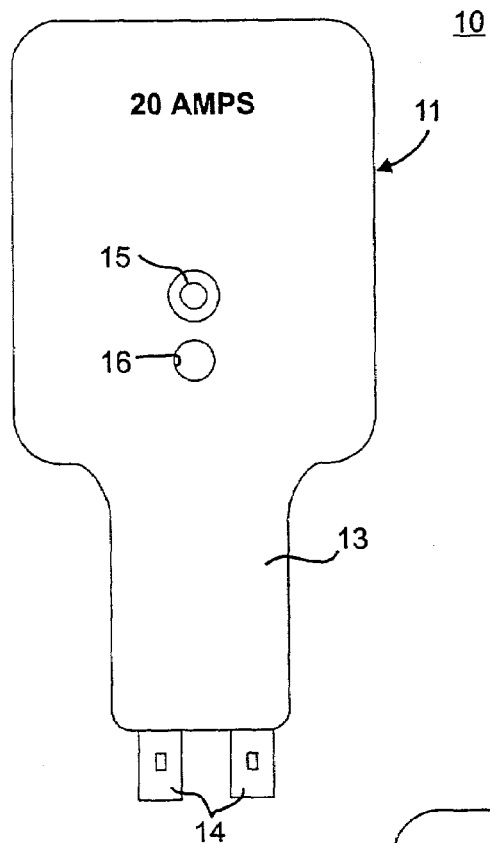
FIG. 1 is a front elevational view of a tester.

Referring to FIG. 1, there is illustrated an electrical system tester, generally designated by the numeral 10, including a housing 11 containing a circuit breaking device 12 (see FIG. 5), which may be a self-resetting thermal breaker of a particular current load rating, such as 20 amps. The housing 11 has a reduced-width and thickness projection 13 extending from one end thereof carrying a pair of spade terminals 14, designed to plug directly into mating terminals of a fuse panel, such as that of an automotive vehicle, the terminals 14 being identical of those of a fuse which is normally mounted in the fuse panel. The housing 11 has an opening 15 therein for viewing a suitable visual indicator, such as an LED flasher, and also has an opening 16 for an audible annunciator device, such as a suitable beeper. The tester 10 is adapted to be plugged directly into a fuse panel in place of a fuse of the same current rating for testing for shorted circuits, the circuit breaking device within the tester 10 preventing current overloads on the circuit without risk of wasting a fuse. It will be appreciated that, in use, a test assembly may comprise a plurality of test units 10, each having a different current rating sufficient to cover all of the fuse ratings in a given fuse panel.

Figure 2:
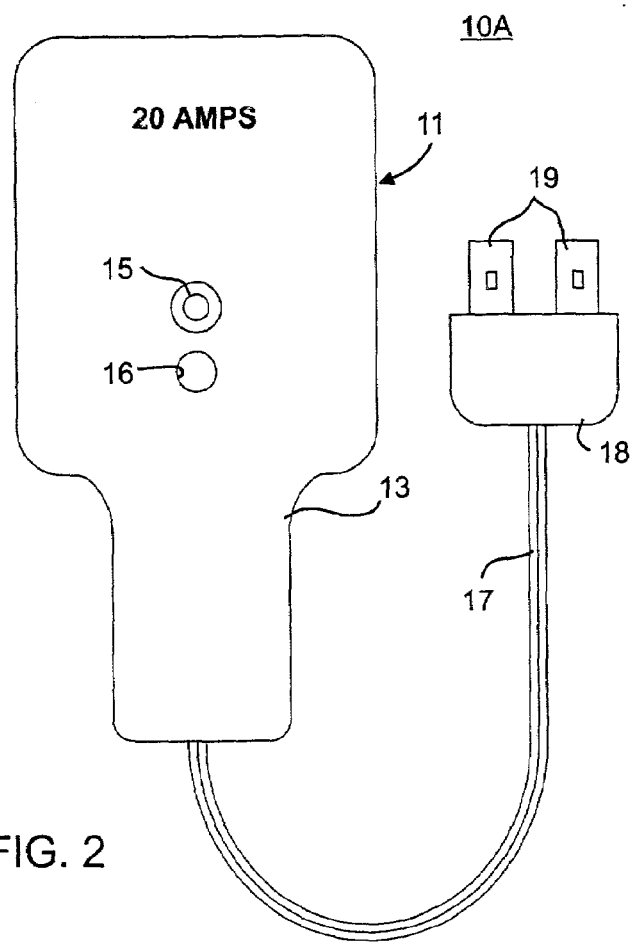
FIG. 2 is a view similar to FIG. 1 of a modified tester.

Referring to FIG. 2, there is illustrated a tester 10A, which is substantially the same as the tester 10 of FIG. 1, except that instead of having spade terminals directly mounted on the projection 13, the circuitry in the tester 10A is coupled by a cable 17, including wire conductors, to a fuse adapter plug 18, which carries spade terminals 19 adapted to be plugged directly into the associated fuse panel. This permits the housing of the tester 10A to be disposed at some distance from the fuse panel to facilitate seeing the visual indicator, in the event that the fuse panel is located in a difficult-to-see location.

Figure 3:
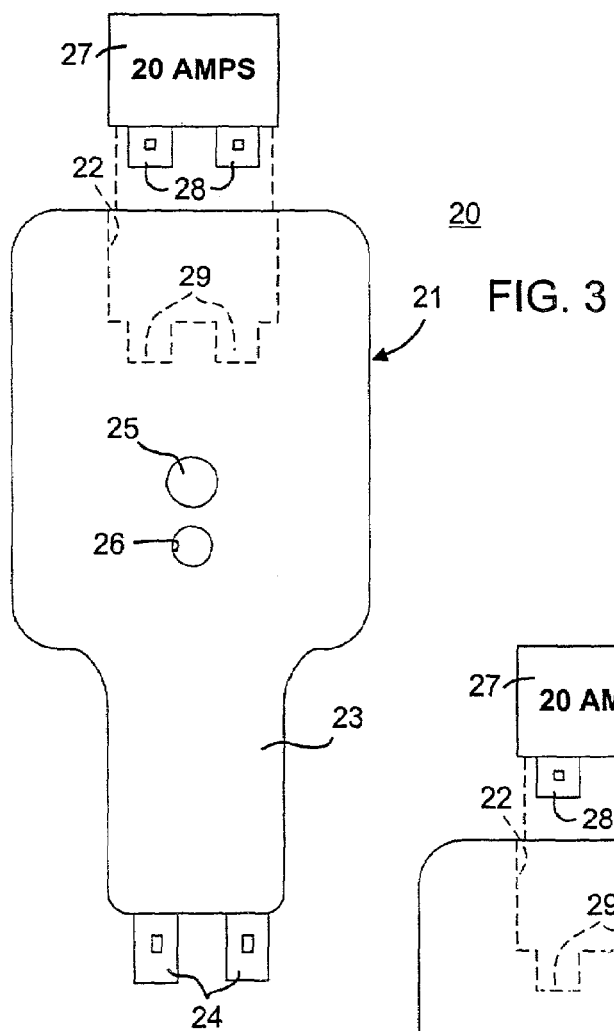
FIG. 3 is a view similar to FIG. 1 of a tester assembly.

Referring to FIG. 3, there is illustrated a tester assembly 20, including a housing 21 provided at one end thereof with a socket 22 and having at the other end thereof a reduced thickness and width projection 23 carrying a pair of spade terminals 24. The housing 21 has a visible and audible indicator holes 25 and 26. The tester assembly 20 also includes a circuit breaker module 27, which includes a circuit breaking device 12 like that in the tester 10, the breaker module having a pair of terminals 28 adapted to be connected with corresponding terminals 29 in the housing 21 when the breaker module 27 is disposed in the socket 22. The breaker module 27 has a predetermined current rating, such as 20 amps, corresponding to the current rating of a fuse to be replaced by the tester assembly 20. The breaker module 27 is a form of male coupling and fits within socket 22, which is a form of a female coupling.

In use, the housing 21 is plugged directly into the associated fuse panel in substitution for a fuse of a circuit to be tested, in the same manner as was described above for the tester 10 of FIG. 1. It will be appreciated that the tester assembly 20 may include a plurality of breaker modules 27, respectively having different current ratings corresponding, respectively, to the different current ratings of the various fuses in a particular fuse panel or the like. Thus, for example, if the tester assembly 20 were to be used to test a circuit fused at 10 amps, a 10-amp breaker module 27 would be plugged into the socket 22. This arrangement has the advantage of being able to test circuits having a variety of different current ratings, while requiring only a single test and indicator circuit.

Figure 4:
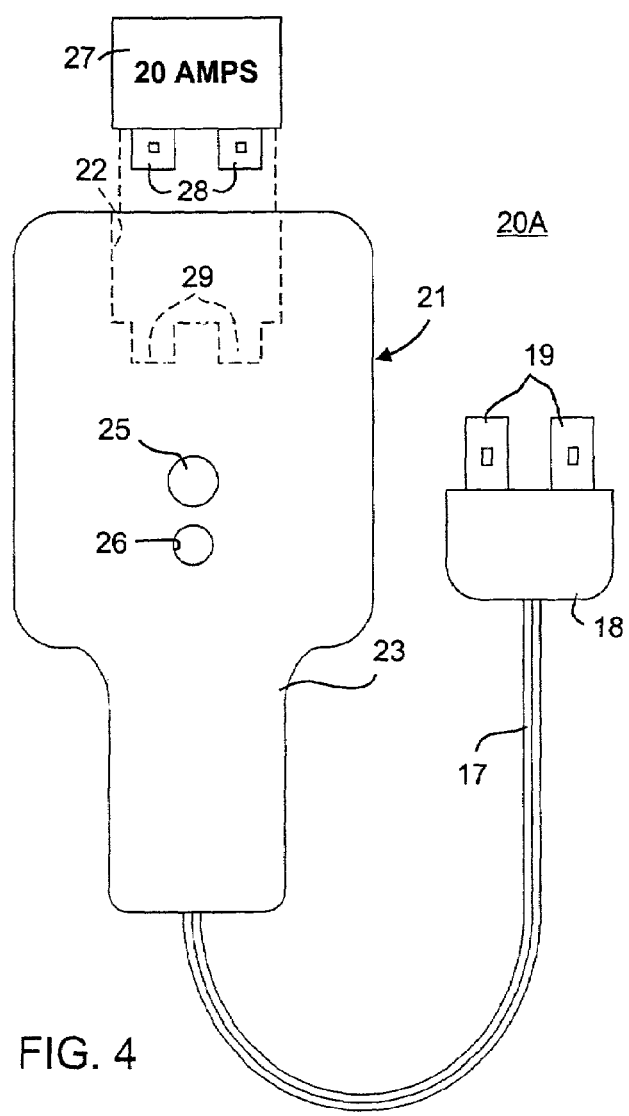
FIG. 4 is a view similar to FIG. 3 of a modified tester assembly.
Figure 6:
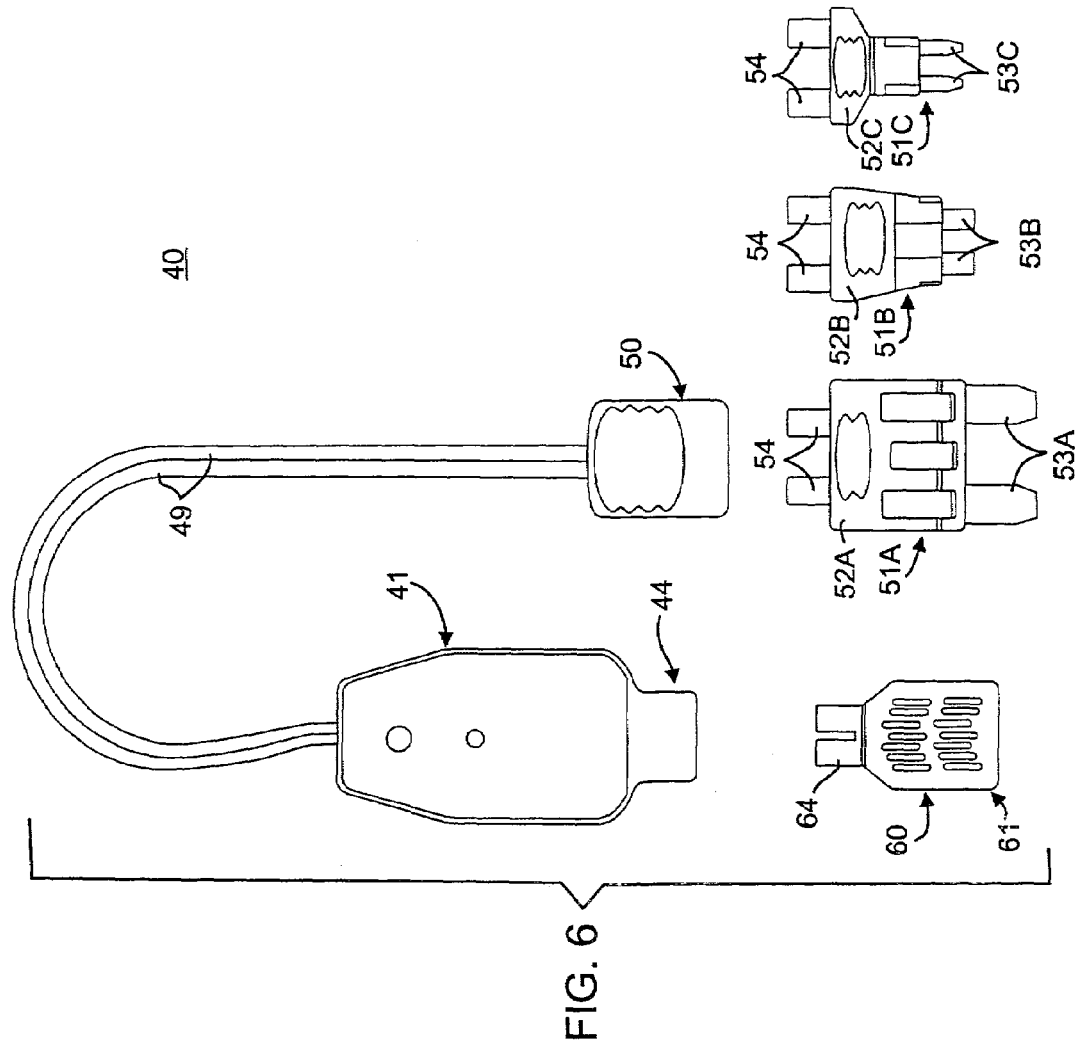
FIG. 6 is a top plan view of yet another tester assembly.

Referring to FIG. 4, there is illustrated a tester assembly 20A, which is substantially the same as the tester assembly 20 of FIG. 3, except that in place of the spade terminals 24 directly mounted on the projection 23, the circuitry in the housing 21 is connected by a cable 17 to a plug 18 carrying terminals 19, like those of the tester 10A of FIG. 2, for plugging into a fuse panel while allowing the housing 21 to be disposed at some distance from the panel.

Figure 5:
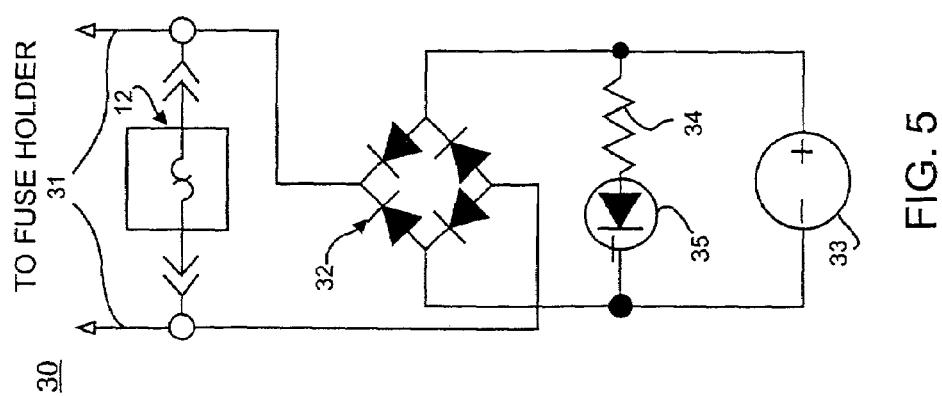
FIG. 5 is a schematic diagram of the circuitry of the testers of FIGS. 1–4.
Figure 7:
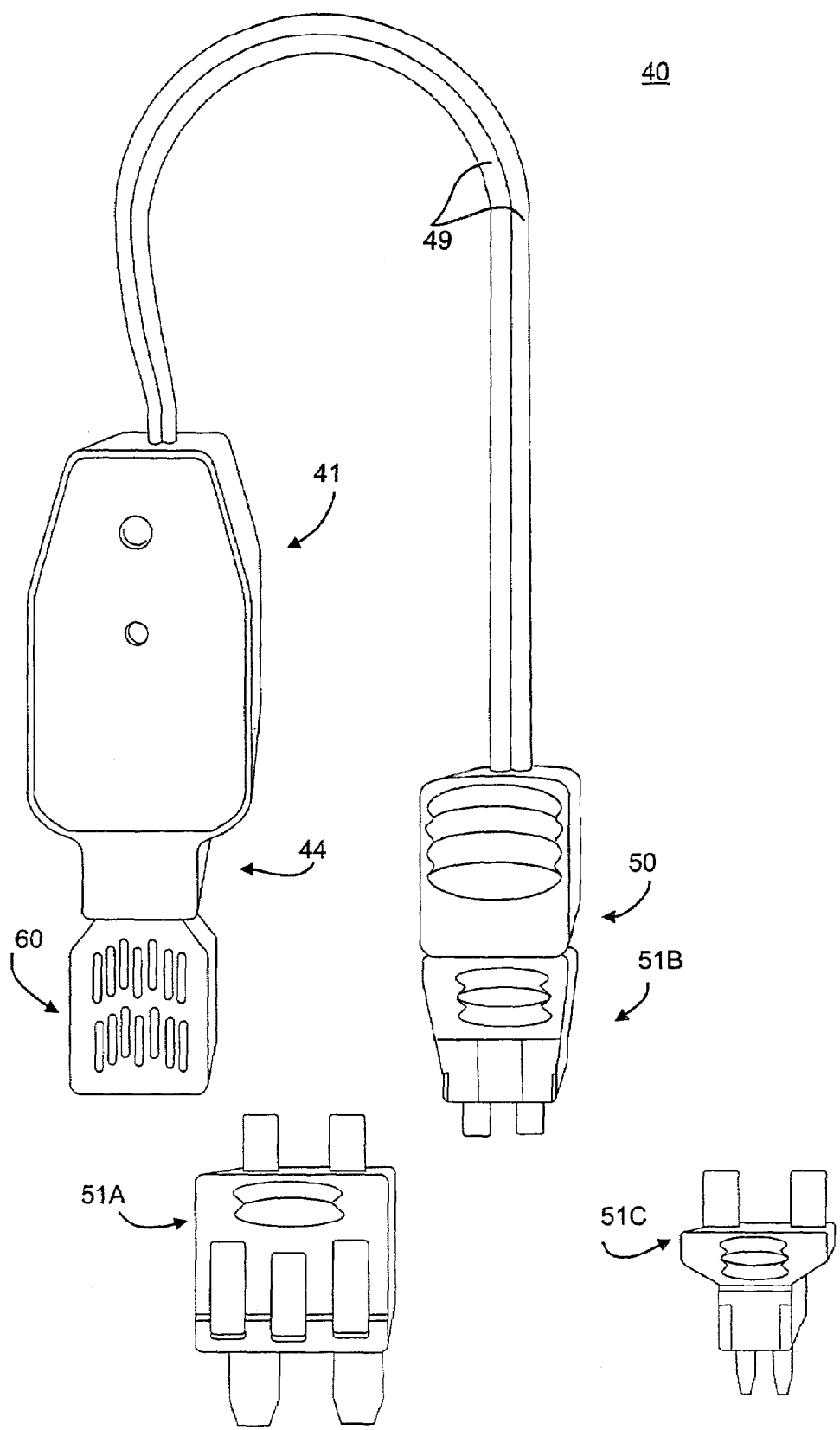
FIG. 7 is a perspective view of the tester assembly of FIG. 5 with the circuit breaker module and one of the plug adapters connected to the main unit.
Figure 8:
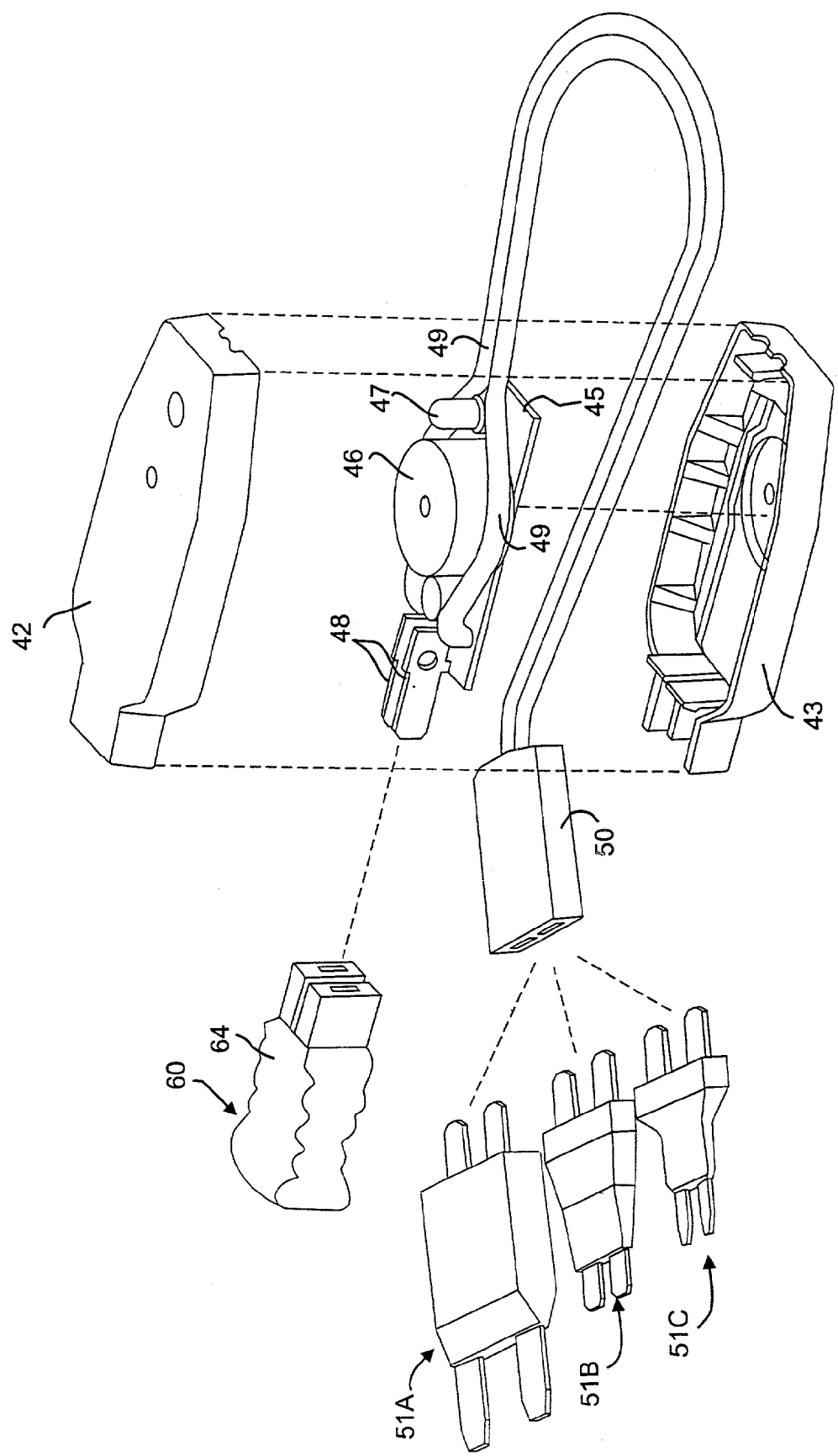
FIG. 8 is an exploded perspective view of the tester assembly of FIG. 7.
Figure 9:
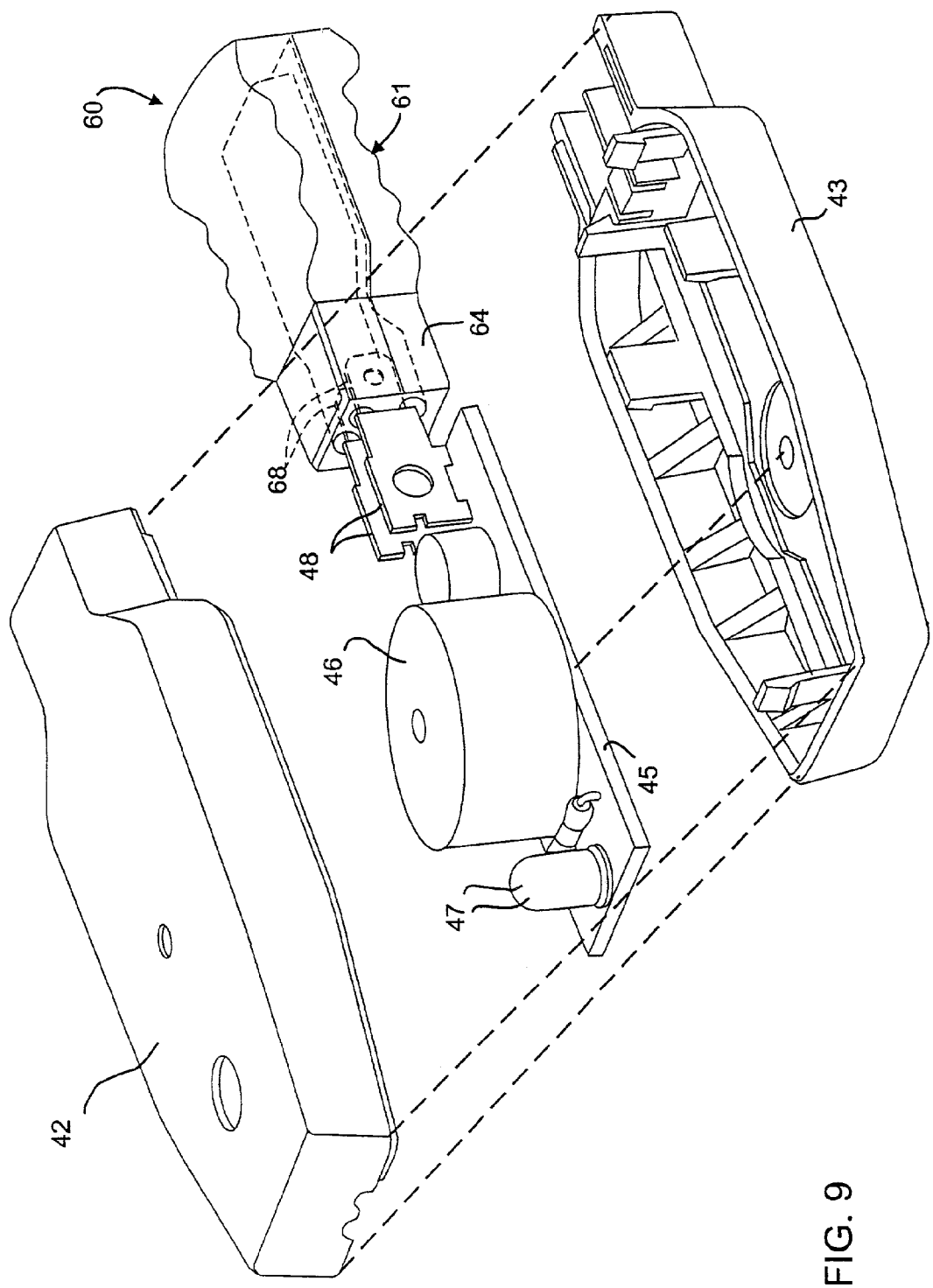
FIG. 9 is an enlarged, exploded, perspective view of a portion of the tester assembly of FIG. 6.
Figure 10:
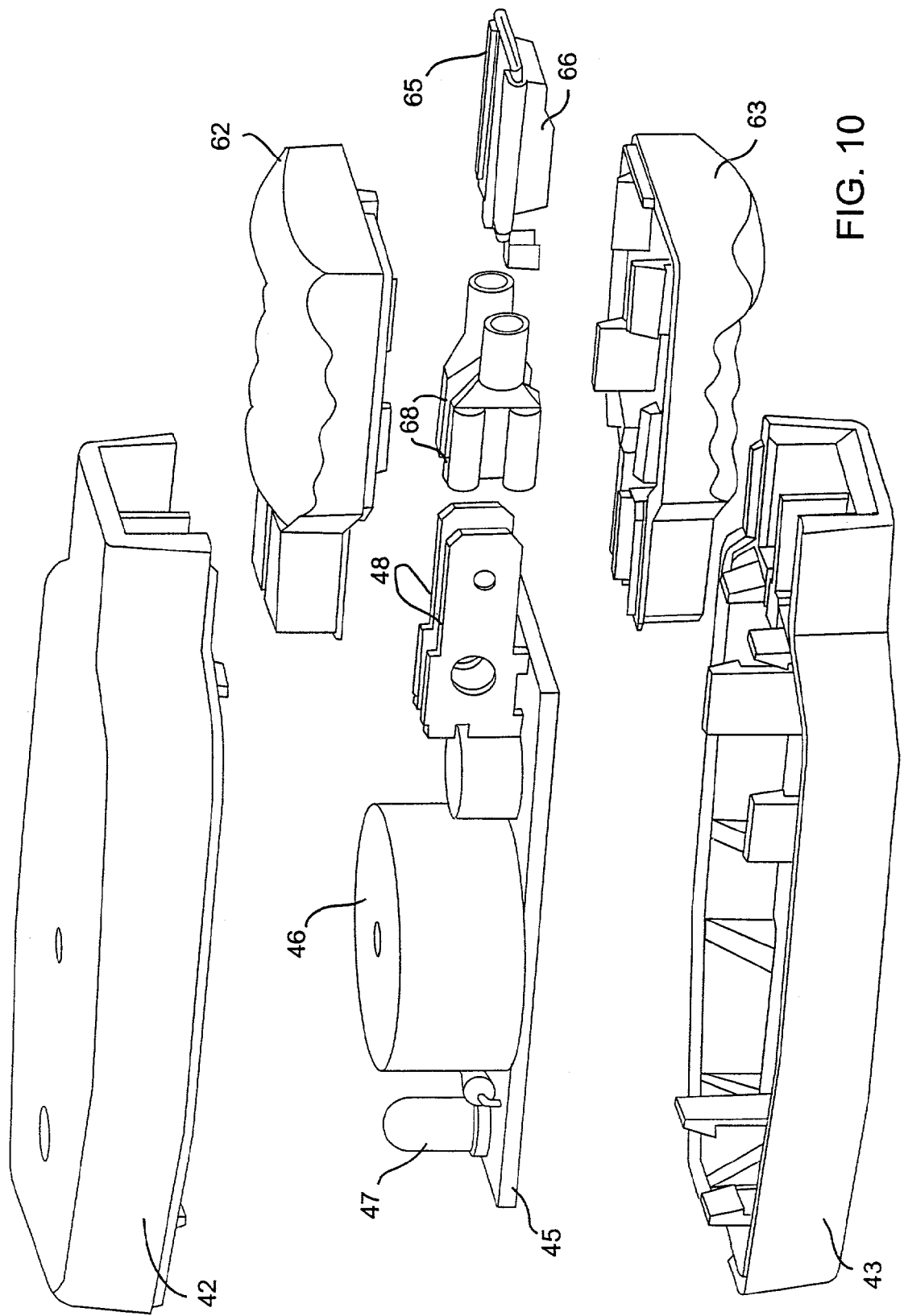
FIG. 10 is another enlarged, perspective and further exploded view of a portion of the tester assembly of FIG. 8.

Referring to FIG. 5, there is illustrated a circuit of the type disposed in the testers 10 and 10A and in the housing 21 of the tester assemblies 20 and 20A, described above. The circuit has terminals 31, which are respectively directly connected to the spade terminals 14 or 24 or to the conductors of the cable 17. The terminals 31 are respectively connected to terminals of a diode bridge 32, the output terminals of which are connected to the terminals of an audible annunciator or beeper 33. Connected in series across the beeper 33 are a resister 34 and an LED 35. It will be appreciated that the beeper 33 is disposed in the housing 11 or 21 immediately beneath the audible indicator hole 16 or 26, while the LED 35 is disposed so as to be visible through the visible indicator hole 15 or 25. The circuit 30 also includes the circuit breaking device 12, which in the case of the testers 10 or 10A would be hard-wired across the terminals 31 and, in the case of the tester assemblies 20 and 20A, would be disposed in the breaker module 27 so as to be capable of being plugged into the socket 22.

Referring now to FIGS. 6–10, there is illustrated a tester assembly 40 which includes a main housing 41, which may include two molded members 42 and 43 joined together by suitable means. The housing 41 has a reduced-thickness neck 44 projecting from one end thereof. Disposed in the housing 41 is a circuit board 45 carrying circuitry which may be essentially like that illustrated in FIG. 5, and including an audible annunciator or beeper 46 and a visible annunciator, such as an LED 47, and having a pair of contact terminals 48 which extend into the neck 44 for cooperation therewith to define a socket. The terminals 48 are also respectively connected to adjacent ends of conductors 49 which form a cable, the opposite end of which is connected to a socket 50.

The tester assembly 40 also includes a plurality of plug adapters, three of which are illustrated and are respectively designated 51A, 51 and 51C. The adapters 51A–C are respectively provided with spade terminals 53A, 53B and 53C of different sizes for respectively plugging into different-sized fuse sockets in a fuse panel. While three of the adapters 51A–C are illustrated, it will be appreciated that any number could be provided, depending upon the number of different types of fuse panel connector terminals with which the tester assembly 40 is intended to be used. Each of the plug adapters 51A–C is also provided at the opposite end thereof with a pair of terminals 54 adapted to be plugged into the socket 50.

The tester assembly 40 also includes a plurality of breaker modules 60 (one illustrated), which are similar to the breaker modules 27 described above in connection with FIG. 3, and respectively have different current ratings. The breaker module 60 has a body or housing 61 which may include two molded body members 62 and 63 adapted to be secured together by any suitable means. The body 61 has a projecting neck 64 at one end thereof and may house a suitable circuit board 65 carrying a circuit breaker 66 of a specified current capacity. The breaker module 60 also includes a pair of terminal 68, which may be disposed in the neck 64 and are adapted to mate with the terminals 48 of the main housing 41 when the neck 64 of the breaker module 60 is plugged into the neck 44 of the main housing 41. It will be appreciated that the tester assembly 40 affords increased flexibility, providing not only a plurality of different current-capacity breaker modules, but also a plurality of different plug adapters, so that the tester assembly 40 may be plugged into a circuit in replacement for any of a variety of different types of fuses.

The electrical system tester shown in FIGS. 13–17 provides rapid repetition rate, short duration current pulses that are applied to produce pulses of load current through the electrical system. Generation of high repetition rate, short duration pulses results in a shorter ON period and less current flow through the system. The operator connects a pair of terminals across a fuse holder while the amperage rating of the blown or removed fuse is set on a potentiometer dial or other reference level indicator. To close the circuit momentarily and respectively and hence, produce load current, a train of current pulses is sent through the system by momentarily and repetitively closing a switch between the terminals in a manner to be described.

A perceptible alert adjustable to turn on at or above a selected current level is produced, thus indicating excessive current draw in the circuit. If the alert is not turned on, the fuse may have blown prematurely, or the short may have been intermittent or non-recurring. If a short exists, the alert pulses on and off which indicates that the circuit is drawing more current than the fuse can carry. A magnetic field is generated surrounding the shorted wiring during the momentary high current pulses. The operator moves a magnetic sensor along the wire to scan and locate the short where the sensor stops indicating current flow. Alternatively, the operator can "jiggle" the wires until the alert stops pulsing.

A potentiometer or other reference adjustment device is manually operated to adjust the amplitude of current pulses according to the current rating of the blown or removed fuse. By adjusting the potentiometer upward until the alert stops, the amount of current drawn by the circuit is indicated.

Figure 11:
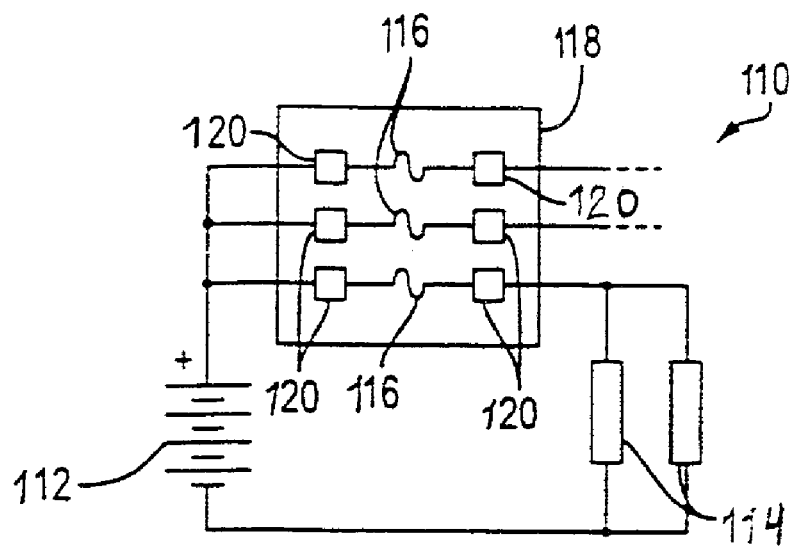
FIG. 11 depicts electrical systems of vehicles in accordance with an illustrative embodiment.

FIG. 11 shows a diagram of an electrical system in a vehicle. System 110 has a plurality of circuits powered by battery 112 which supplies DC power to various electrical loads such as light, motorized parts and other DC components as depicted by loads 114. A set of fuses 116 is included in fuse box 118 and positioned in fuse holders 120 in a removable configuration. Each fuse is in series with its corresponding circuit and has amperage to match the current carried by that circuit. The fuse current rating is such that it trips or blows before excessive current damages the main components in the event a short circuit occurs or a part of the circuit draws a large amount of current.

Figure 12:
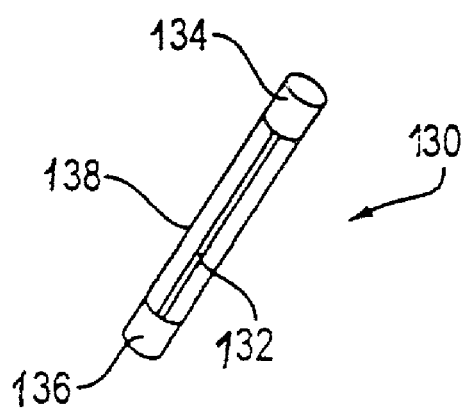
FIG. 12 shows a kind of fuse usable in electrical systems of vehicles.

FIG. 12 shows a typical fuse used in automotive electrical circuits. Fuse 130 has a resistive element 132 that may be protected inside an insulating encasing such as tube 138. The resistance of element 132 determines the current rating of the fuse as higher resistance corresponds to higher rating where lower resistance provides a low current rating for the fuse. Conductive heads 134 and 136, connected to both ends of the fuse, make contact with conductive receptacles by being seated in fuse holders 120, as shown in FIG. 11.

Figure 13:
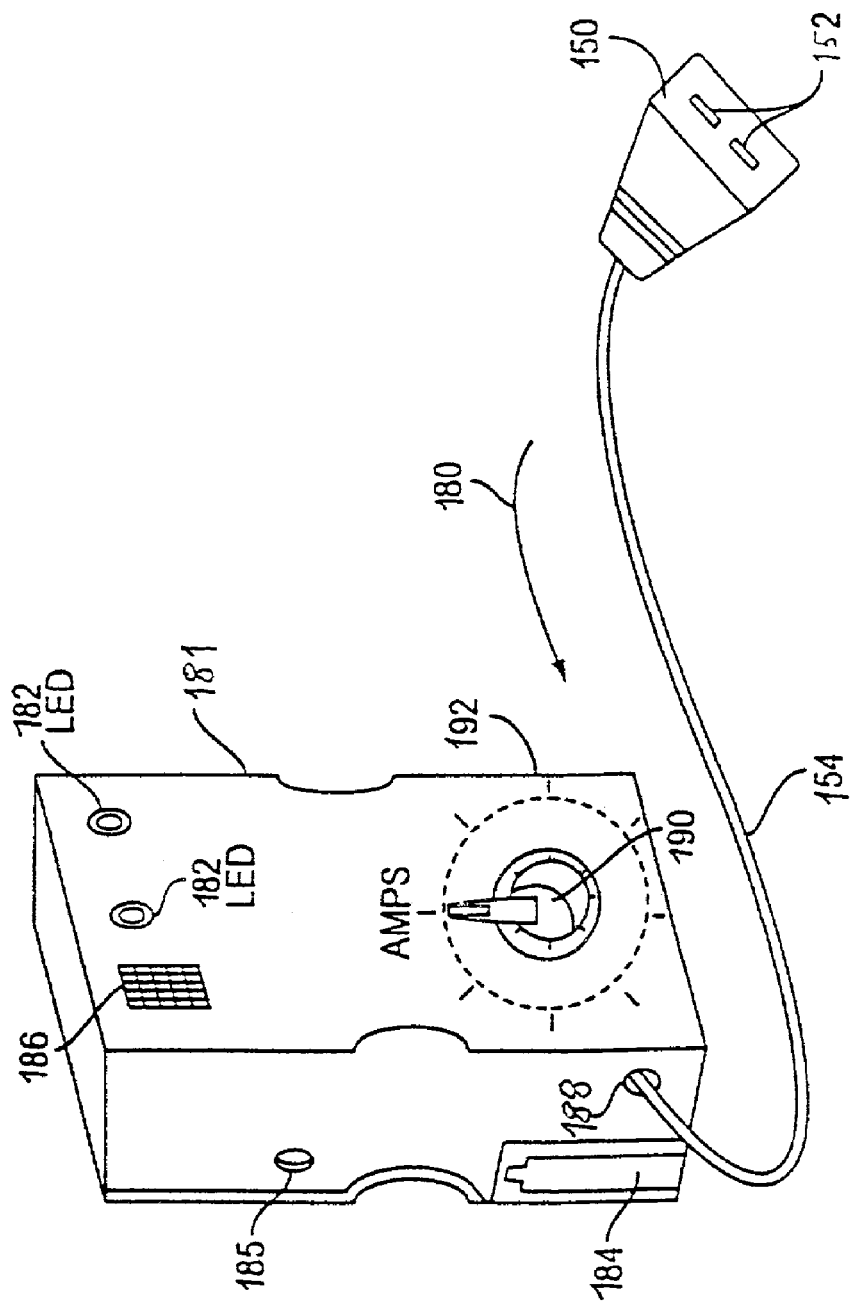
FIG. 13 illustrates one example of the housing of another form of the described electrical system tester.

Referring to FIG. 13, the external configuration of the electrical tester is described showing an example of the housing and external features of the tester. Housing 181 holds and shelters the circuitry of the electrical system as well as providing various terminals on its outer surface for indicators and connection to other devices. LED windows 182 and alarm audio output 186 provide perceptible diagnostic indicators. Compartment 184 is positioned on one of the surfaces of housing 181 and provides a place for removable batteries allowing the tester to be portable. Alternatively, an AC adapter may be connected to AC outlet 185 for providing power when batteries are not in use. Connector outlet 188 provides the terminal for plugging tester cord 154 which in turn is connected to tester inlet plug 150 having plug inserts 152. A pair of removable terminals such as alligator clips or other appropriate connectors are implemented to connect the, tester inlet plug to the fuse circuit across fuse holder 120, shown in FIG. 11. Housing 181 further includes dial 190 which sweeps across current scale 192 marked to indicate current rating scales for the test. The dial selects a current rating from the current scale and sets the tester to currents typical of automotive circuits.

Figure 14:
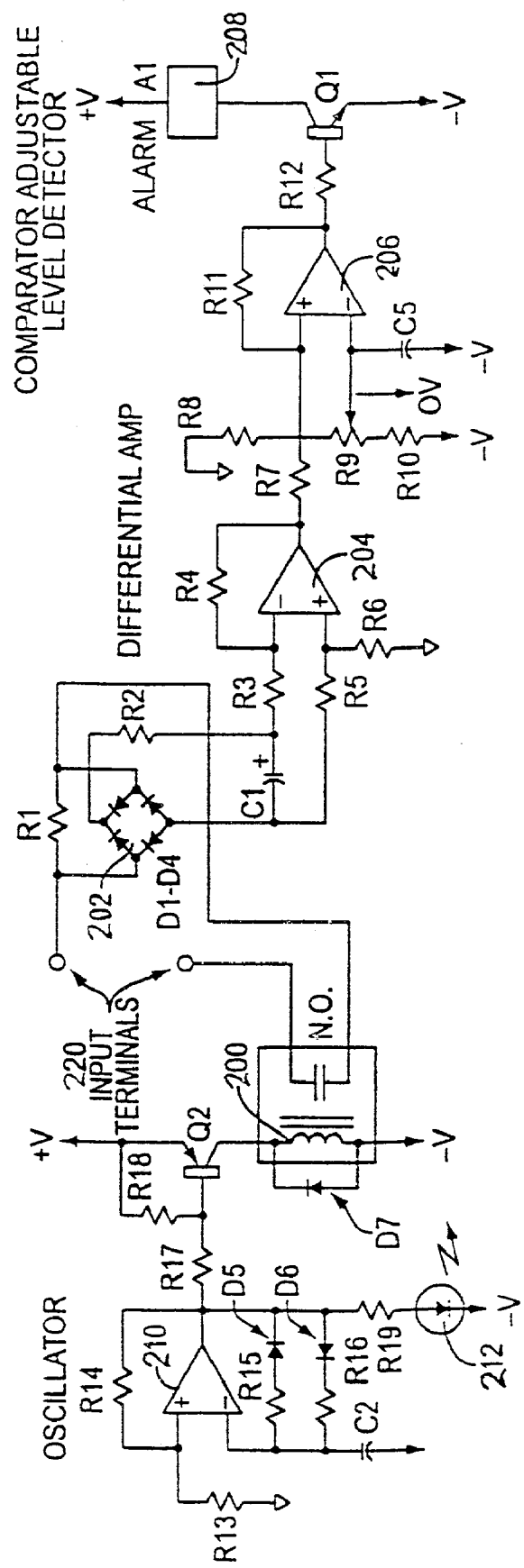
FIG. 14 illustrates a circuit diagram that may be used in the electrical tester of FIG. 13.

An example of a circuit diagram of the electrical system tester is shown in FIG. 14. The tester includes a pair of input terminals 220 for use across fuse holder 120, shown in FIG. 11. Resistor R1 is wired in series with a normally open contact of electromechanical relay 200. The contact momentarily and repeatedly closes to produce a short duration current pulse from an electricity source through the input terminals and the fuse holder in the electrical circuit. An input voltage develops across R1 determined by the current flow through the resistor according to Ohm's law.

The input voltage is applied to the tester circuit through full-bridge rectifier 202 comprised of diodes D1–D4 to provide a positive voltage signal through current limiting resistor R2. This input voltage is independent of direction of connection of the pair of contacts across the input terminals. That is, the use of the full-bridge rectifier allows the connection of contacts across the fuse holder be made without the need for complying with the polarity, thus speeding up the testing process. In a full-bridge rectifier, current flows through two diodes in any one direction. In case of germanium diodes, for example, the total voltage drop is approximately 0.6 volt, which is twice the 0.3-volt drop across each diode.

Capacitor C1 is connected across the rectifier terminals and is charged by the input voltage pulses through resistor R1. The network of C1-R1 provides a low-pass filter function and stores the input voltage momentarily. The stored voltage across capacitor C1 is presented to a differential amplifier circuit comprising first operational amplifier 204 and resistors R3–R6. Resistor values are chosen to provide a stage gain of −1. The operational amplifier may be a discrete component or a part of an integrated circuit with multiple amplifiers IC1 on one single chip, such as LM324. The output of this amplifier is referenced to common bus in the circuit and pulses toward the negative power supply rail, −V, synchronized with the voltage across C1.

The output from the differential amplifier is coupled through resistor R7 to a voltage comparator circuit, comprised of a second operational amplifier 206. A trip point reference, for indicating the amperage rating of the blown or removed fuse, is provided by a voltage divider circuit comprised of resistors R8–R10 and connected between circuit common and the negative power supply rail, −V. Resistor R9 is an adjustable resistor or potentiometer mounted on the front panel of the housing, for selecting the comparator trip point. As shown in FIG. 13, dial 190 is attached to the shaft of resistor R9 on the negative input of operational amplifier 204 and selects different amperage settings on scale 192. Changing the resistance value facilitates the operator adjustments to the tester according to the amperage rating of the blown or removed fuse. Resistor R11, connected across operational amplifier 206 as the feedback resistor, provides hysteresis to the comparator for stability. Capacitor C5 is connected between the negative input of the operational amplifier 206 and negative power supply to minimize noise on the comparator reference.

The output from the comparator is used to switch an alarm 208 when the comparator output is high. The switching is achieved by coupling the comparator output through resistor R12 to drive transistor Q1, energizing alarm 208. The alarm generates an audible alert sound to be outputted from audio alarm 186, as shown in FIG. 13. The alarm may be a lighted indicator or a device generating any humanly perceptible signal. As an example, an alarm sounder MSR-320 may be used to generate the audible alarm signal. The alarm stays on during the period that the voltage across capacitor C1 remains larger than the set-point voltage of the comparator. This time period is substantially longer than the relay contact closure to allow audible perception by the operator. A typical on-time period for the alarm may be approximately 100 milliseconds.

Further referring to FIG. 14, a pulsating astable oscillator is configured to generate control pulses across relay 200, which momentarily and repeatedly closes the circuit between contacts 220. Thus, current pulses from the electricity source are generated through the electrical system under test. The oscillator incorporates operational amplifier 210 and resistors R13–R16 where resistor R14 is connected across the operational amplifier as the feedback resistor. Resistors R15 and R16 are each in series with one of stabilizing diodes D5 and D6 connected across operational amplifier 210. Resistor R15 and diode D5 set output current pulse duration where resistor R16 and diode D6 set repetition rate of the pulse train. Capacitor C2, connected between the negative input of operational amplifier 210 and the negative power supply.

As shown in FIG. 14. the output of the oscillator drives transistor Q2 through resistor R17. The transistor is on when the output of the oscillator is low for approximately 10 milliseconds. In its ON-state, transistor Q2 energizes the coil of relay 200, thus closing the contacts arranged across a fuse holder as described above with respect to the electrical system tester. Resistor R18, shunting transistor Q2, insures that transistor Q2 is switched off as the high output of the operational amplifier falls approximately 1.5 volts below the positive supply rail, +V. Thus, contacts 220 may be momentarily and repeatedly closed as transistor Q2 switches on and off and energizes the coil of relay 200 during its ON state. Additionally, diode D7 is positioned across switch 200 and shunts inductively generated noise spikes across relay coil 200 as the current pulses are generated.

The output of operational amplifier 210 further drives an indicator device to signal the operator of the tester of the time period during which the current pulse is on. An indicator device may be a light emitting diode (LED), audio alarm or any perceptible signal. For example, as shown in FIG. 16, LED 212 through resistor R19 is connected between the output of operational amplifier 210 and the negative power supply. LED 212 lights up when the output of the oscillator is high for approximately 1 second, to indicate that the current pulse is generated. LED 212 may be mounted on tester housing box 181 under one of LED windows 182.

Figure 15:
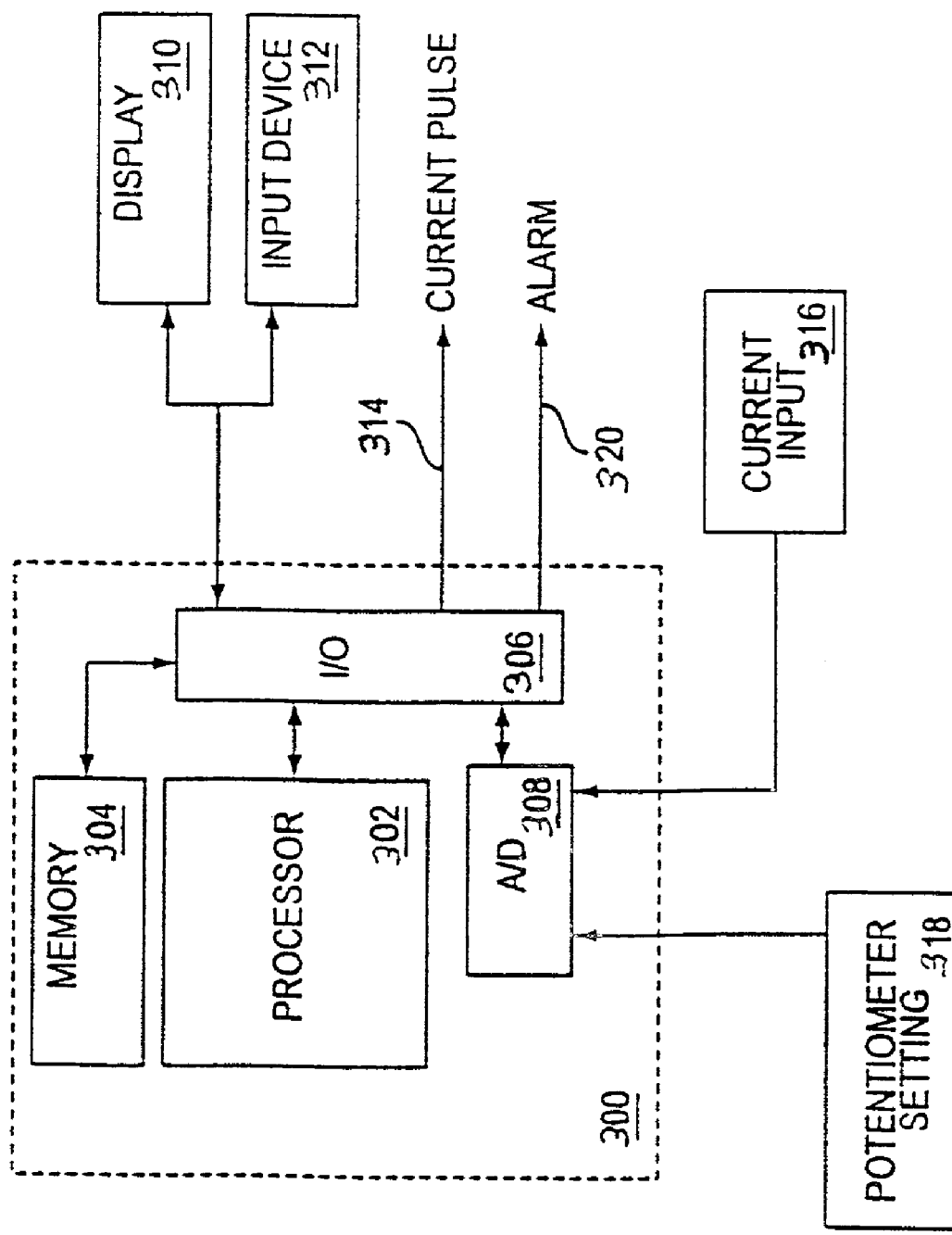
FIG. 15 represents a general configuration of an alternate microprocessor-based form of electrical tester that may be used with the electrical tester of FIG. 13.

A microprocessor in lieu of discrete circuitry may be used to control the momentarily closing of the contacts across a fuse holder to produce a current pulse from an electricity source through the electrical system. An example of such system is described in FIG. 15, showing microprocessor-based system 300, which includes microprocessor 302, memory device 304 and I/O port 306 for communicating information and instructions. Microprocessor 302 is programmed to generate a control pulse for momentarily and repeatedly closing the circuit across fuse holder 120, as shown in FIG. 11, of a predetermined frequency and pulse width. The processor is further programmed to compare the magnitude of the current pulse drawn by the electrical circuit under test from the electricity source with a prescribed reference current value as set by the current rating of the blown or removed fuse. Analogue to digital (A/D) converter 308 is the gateway for receiving the current setting from dial 190, shown in FIG. 13, and providing a digital current threshold setting to microprocessor 302. Additionally, A/D converter 308 receives and converts current levels drawn by the circuit under test to provide digital current pulse readings corresponding to the excessive current drawn by the circuit. The current pulse readings are then sent to microprocessor 302, through I/O port 306.

The microprocessor compares the current pulse readings from the circuit under test with the threshold rating of the fuse. If the electrical system draws more current than the threshold level, signal 320 is generated to switch an alarm on, indicating the presence of current through the electrical system above the rating of its corresponding fuse. The microprocessor is further programmed to keep the alarm on long enough for the operator to perceive the signal. The signal may be an audible, a visible signal such as an LED or both. Other indicators, similar to those described in reference to FIG. 14, may be activated by output signals of the microprocessor. FIG. 15 further shows display device 310 and input device 312 connected to the microprocessor through I/O ports 306 for programming the microprocessor-based system as well as performing tests.

Referring to FIG. 16(A), control pulses 400 represent the pattern of momentarily and repeatedly closing of the contacts across the fuse holder of a blown or removed fuse. The repetition rate of the pulse may be on the order of one pulse per second. Pulses are controlled to have a width within the range of 10–20 ms. Both the microprocessor of FIG. 15 and the circuit of FIG. 14 may be programmed or designed to provide control pulses within the specified frequency and duration.

FIG. 16(B) shows current pulses 450, having the same frequency as control pulses 400, representing the current drawn by the electrical circuit under test from the electricity source. Current level 470 denotes a prescribed reference current value or a threshold level representing the current rating of the blown or removed fuse as set by dial 190 on the front of housing 180 shown in FIG. 13. Current pulses 460 demonstrate current drawn by the electrical circuit from the electricity source which may be in excess of threshold level 470 in the event a short circuit exists or a part of the circuit draws excessive current. The comparator circuit or the programmed microprocessor-based system compares the amplitude of pulses 460 with threshold current level 470. The tester generates a perceptible alarm upon detection of current drawn by the electrical circuit in excess of the prescribed reference current.

Figure 17:
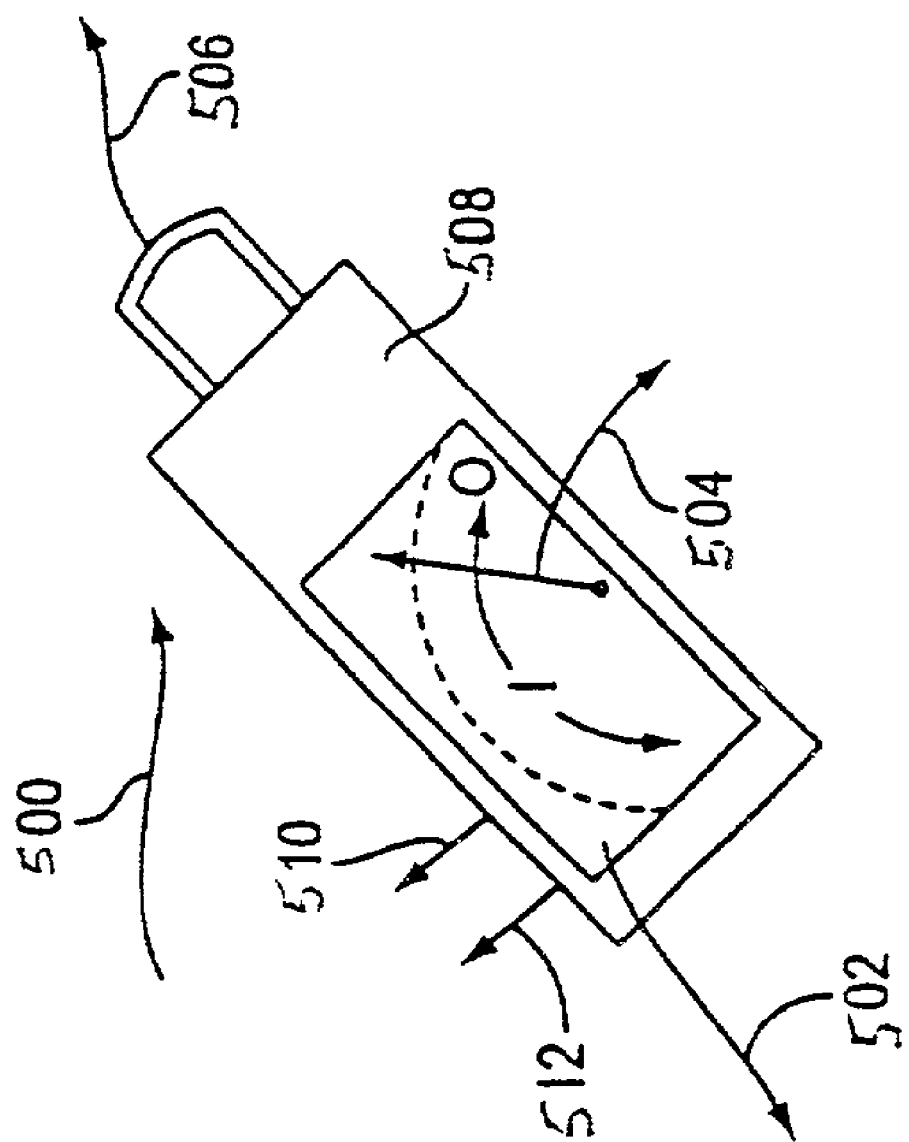
FIG. 17 shows a configuration of a magnetic current tracer usable with the electrical tester of FIG. 13.

A magnetic detector may be used to locate a short when excessive current drawn by the electrical circuit is detected. The detector indicates a magnetic field surrounding the shorted wiring during the momentary high current pulses as a result of the repetitive switching action. An example of such magnetic sensor is described in FIG. 17 showing sensor 500 having housing 508 upon which conductive loop 506 for sensing magnetic field is attached. Ports 510 and 512 provide connections to ground and power supply respectively. The presence of magnetic field is shown by deflection of needle 504 or other kinds of indicators, such as strip gauges or digital displays, positioned in display window 502. By moving the magnetic sensor along the wiring of the circuit under test, a short is located when the sensor stops indicating current flow. The magnetic sensor may be a separate unit or an integral part of the disclosed electrical system tester. Other modifications may be made to the housing of the tester to provide for an integrated or detachable magnetic sensor coupled with the tester.

The electrical system tester of FIGS. 13–15 derives power from a 9-volt battery and a voltage regulator that provides a regulated 5-volt supply between the negative power supply rail, −V, and circuit common. It is obvious that alternative power supply arrangements can be included. Depending on the particular design and configuration, removable power cells, AC adapters and other sources of power can be added to the tester. The power supply can be a removable unit inserted in a battery receptacle with or without a port for connection to an AC adapter.

The power supply unit in the described electrical system testers can have various configurations depending on the specific application. For example, the power supply can be in the form of various types of batteries capable of supplying the requisite power supply. The batteries can be conventional alkaline batteries, high quality Lithium ion batteries, or customized power cells. The batteries may be rechargeable in order to provide convenient and repeated use. Such rechargeable batteries can be in the form of Nickel Cadmium (NiCd) or Nickel Metal Hydride (NiMH) batteries. It should be noted however, that any other type of rechargeable battery capable of providing the requisite power output could be used in the present electrical system testers.

It is apparent that the construction of the disclosed electrical system testers can be such that a compact, hand-held and simple version of the device is provided. The testers can be constructed from materials that provide impact protection so that the tester withstands repeated falls from various heights.

The embodiments described herein can include any appropriate voltage source, such as a battery, an alternator and the like, providing any appropriate voltage, such as about 13 Volts, about 43 Volts and the like.

The embodiments described herein can be used with any desired system or engine. Those systems or engines may comprises items utilizing fossil fuels, such as gasoline, natural gas, propane and the like, electricity, such as that generated by battery, magneto, solar cell and the like, wind and hybrids or combinations thereof Those systems or engines may be incorporated into another systems, such as an automobile, a truck, a boat or ship, a motorcycle, a generator, an airplane and the like.

The described tester of FIGS. 13–15 advantageously allows an operator to test electrical systems for current flow that exceeds a prescribed reference current value by producing high frequency current pulses through the system. Indicators signal the presence of current level above the reference current value. The operator then determines the location of circuit fault in a short period of time without long term exposure of the electrical system to dangerously high levels of current sent through the system during each pulse.

From the foregoing, it can be seen that there has been provided an improved test apparatus for testing shorted or grounded circuits, which provides both visible and audible indications and can be plugged directly into a variety of different types of fuse panels in place of a fuse of a fused circuit to be tested, while affording effective overload protection during a test.

While particular embodiments have been shown and described, it will be apparent to those skilled in the art that changes and modifications may be made without departing from the principles of the testing technique in its broader aspects. The matter set forth in the foregoing description and accompanying drawings is offered by way of illustration only and not as a limitation.

What is claimed is:

1. A tester for testing an electrical system for excessive current flaw, which system is powered by an electricity source and includes a fuse holder for a fuse having a predetermined rating, the tester comprising:
   a pair of contacts removably electrically coupleable across the fuse holder;
   a switch coupled with the contacts and coupleable with the electricity source, the switch being momentarily closeable to pass a current pulse to the fuse holder;
   a controller, coupled to the switch that controls the switch to momentarily close repeatedly;
   a comparator that compares the magnitude of the current pulse with a prescribed reference current value;
   an indicator that produces a perceptible signal when the magnitude of the current pulse exceeds that of the prescribed reference current value; and
   a rectifier in circuit with the pair of contacts, wherein the rectifier produces an input voltage signal that is independent of the polarity of the connection to the pair of contacts.

2. The tester according to claim 1, wherein the controller comprises an oscillator that generates control pulses of a predetermined width and frequency.

3. The tester according to claim 2, wherein the pulse width of the control pulses is within the range of about 10–20 milliseconds and the pulse repetition rate is at about one cycle per second.

4. The tester according to claim 1, further comprising a resistor in series with the pair of contacts and a differential amplifier coupled to the resistor, wherein the differential amplifier detects a voltage drop across the resistor.

5. The tester according to claim 1, wherein the comparator includes an operational amplifier.

6. The tester according to claim 1, further comprising a microprocessor programmed for
   momentarily closing the switch to produce a current pulse from the electricity source through the electrical system;
   comparing the magnitude of the current pulse with a prescribed reference current value; and
   producing a perceptible signal when the magnitude of the current pulse exceeds that of the prescribed reference current value.

7. A device for testing an electrical system according to claim 6, wherein the steps (a) trough (c) are repeated to generate current pulses having a predetermined width and frequency.

8. A device for testing an electrical system according to claim 7, wherein the current pulse width is about 10–20 milliseconds and the pulse repetition rate is about one cycle per second.

9. A method of testing an electrical system for current flow exceeding a prescribed value, which system is powered by an electricity source and includes a fuse holder for a fuse having a predetermined rating, the method comprising the steps of:
   removably connecting a pair of contacts across the fuse holder;
   momentarily closing a circuit between the contacts to produce a current pulse from the electricity source through the electrical system;
   comparing the magnitude of the current pulse with a prescribed reference current value;
   producing a perceptible signal when the magnitude of the current pulse exceeds that of the prescribed reference current signal; and
   generating a positive voltage signal through the system independent of a polarity of the pair of contacts.

10. A method of testing an electrical system as in claim 9, further comprising:
    repeating the step of momentarily closing the circuit between the contacts to produce repeating current pulses through the electrical system.

11. The method of testing an electrical system as in claim 10, wherein the current pulses are produced at a rate of one pulse per second.

12. The method of testing an electrical system as in claim 11, wherein each of the current pulses has a duration within the range of 10–20 milliseconds.

13. A method of testing an electrical system as in claim 9, further comprising the step of setting the prescribed reference current value according to the current rating of a fuse specified for connection to the fuse holder.

14. A method of testing an electrical system according to claim 13, wherein the prescribed reference current value is set by adjusting a variable resistor.

15. A method of testing an electrical system according to claim 9, further comprising the step of establishing a location of a short circuit when the perceptible signal is produced.

16. A tester for testing an electrical system, which system includes a fuse holder for a fuse having one of a plurality of possible predetermined ratings, the tester comprising:
    an indicator unit including a first pair of contacts removably electrically coupleable to the fuse holder and a second pair of contacts electrically coupled to the first pair of contacts and an indicator coupled to the second pair of contacts; and
    a circuit breaking module having a third pair of contacts for removably coupling to the second pair of contacts, the circuit breaking module including a circuit breaker having a predetermined current load rating;
    wherein the indicator produces a perceptible signal when an overcurrent situation exists in the circuit breaking module.

17. The tester of claim 16, further comprising a housing crying the indicator, wherein one of a male coupling and a female coupling includes the second pair of contacts and is carried by the housing, the other of the male coupling and the female coupling includes the third pair of contacts and is carried by the first circuit breaking module; and the male coupling is removably insertable in the female coupling for electrically coupling the second and third pairs of contacts.

18. The tester of claim 17, wherein the one of the male coupling and the female coupling comprises a socket in the housing and the first circuit breaking module is removably insertable in the socket for electrically coupling the second and third pairs of contacts.

19. The tester of claim 16, further comprising a further circuit breaking module having a fourth pair of contacts for removably coupling to the second pair of contacts, the further circuit breaking module including a further circuit breaker having a further predetermined current load rating.

20. The tester of claim 19, wherein the predetermined current load rating is different from the further predetermined current load rating.

* * * * *

UNITED STATES PATENT AND TRADEMARK OFFICE
CERTIFICATE OF CORRECTION

| | | |
|---|---|---|
| PATENT NO. | : 7,148,698 B2 | Page 1 of 1 |
| APPLICATION NO. | : 10/251242 | |
| DATED | : December 12, 2006 | |
| INVENTOR(S) | : Becker et al. | |

It is certified that error appears in the above-identified patent and that said Letters Patent is hereby corrected as shown below:

Title Page, under (75) Inventors: the name "Matthew D. Crass" should read --Matthew M. Crass--

Signed and Sealed this

Third Day of April, 2007

JON W. DUDAS
*Director of the United States Patent and Trademark Office*